United States Patent
Chen et al.

(10) Patent No.: US 8,809,670 B2
(45) Date of Patent: *Aug. 19, 2014

(54) SOLAR ENERGY MODULE

(75) Inventors: Ruei-Tang Chen, Tainan (TW);
Gan-Lin Hwang, Tainan (TW);
Ping-Yuan Tsai, Kaohsiung (TW);
Joseph Lik-Hang Chau, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 155 days.

This patent is subject to a terminal disclaimer.

(21) Appl. No.: 12/626,896

(22) Filed: Nov. 28, 2009

(65) Prior Publication Data

US 2010/0282296 A1    Nov. 11, 2010

Related U.S. Application Data

(60) Provisional application No. 61/176,040, filed on May 6, 2009.

(51) Int. Cl.
*H02N 6/00* (2006.01)
*H01L 31/00* (2006.01)
*H01L 31/052* (2014.01)
*G09F 15/00* (2006.01)
*G09F 13/08* (2006.01)
*G09F 13/18* (2006.01)
*G09F 13/22* (2006.01)
*G09F 13/04* (2006.01)

(52) U.S. Cl.
CPC ........ *G09F 13/22* (2013.01); *G09F 2013/1854* (2013.01); *G09F 2013/222* (2013.01); *H01L 31/0522* (2013.01); *Y02B 10/12* (2013.01); *G09F 2013/1836* (2013.01); *G09F 15/0037* (2013.01); *G09F 2013/1877* (2013.01); *G09F 2013/0459* (2013.01); *G09F 13/18* (2013.01); *G09F 2013/0431* (2013.01); *Y02E 10/52* (2013.01); *G09F 13/08* (2013.01); *G09F 2013/1831* (2013.01)
USPC ............ 136/246; 136/259; 136/261; 136/262

(58) Field of Classification Search
USPC .......... 136/243, 244, 246, 252, 259, 261, 262
See application file for complete search history.

(56) References Cited

U.S. PATENT DOCUMENTS 3,696,294 A * 10/1972 Krupka ........................ 324/105
4,116,718 A    9/1978 Yerkes et al.
(Continued)

FOREIGN PATENT DOCUMENTS

CN    2872525 Y    2/2007
EP    1670065    6/2006
(Continued)

OTHER PUBLICATIONS

Peter A. Lewis "Pigment Handbook vol. I: Properties and Economics, 2nd Edition", John Wiley & Sons, New York , pp. 1-3 (1988).*

(Continued)

*Primary Examiner* — Alexander Kollias

(57) ABSTRACT

A solar energy module is provided and includes a substrate comprising at least one light diffusion layer and a plurality of light guiding layers adjacent to the light diffusion layer, and solar chips disposed on the lateral surfaces of the substrate. Solar light enters the substrate and is diffused by the light diffusion layer, and the diffused solar light is reflected by an interface of the light diffusion layer and the light guiding layer and is collected by the solar chips. A part of the solar light enters the light guiding layers and is reflected by the interface of the light guiding layers, and the reflected light is collected by the solar chips.

9 Claims, 2 Drawing Sheets

(56) References Cited

U.S. PATENT DOCUMENTS

| | | | |
|---|---|---|---|
| 4,144,097 A | 3/1979 | Chambers et al. | |
| RE30,043 E * | 7/1979 | Moncrieff-Yeates | 126/502 |
| 4,193,819 A | 3/1980 | Wohlmut | |
| 4,311,869 A * | 1/1982 | Kurth et al. | 136/246 |
| 5,076,674 A * | 12/1991 | Lynam | 359/274 |
| 7,731,383 B2 | 6/2010 | Myer | |
| 8,277,072 B2 * | 10/2012 | Chen et al. | 362/183 |
| 2004/0245900 A1* | 12/2004 | Parkkinen | 312/401 |
| 2005/0146874 A1 | 7/2005 | Cech et al. | |
| 2006/0050528 A1 | 3/2006 | Lyons et al. | |
| 2006/0180200 A1* | 8/2006 | Platzer et al. | 136/265 |
| 2006/0262522 A1 | 11/2006 | Allsop et al. | |
| 2009/0021210 A1 | 1/2009 | Korall et al. | |
| 2009/0056791 A1* | 3/2009 | Pfenninger et al. | 136/247 |
| 2009/0126792 A1* | 5/2009 | Gruhlke et al. | 136/259 |
| 2009/0199900 A1* | 8/2009 | Bita et al. | 136/259 |
| 2010/0108056 A1 | 5/2010 | Lin et al. | |
| 2010/0281721 A1 | 11/2010 | Chen et al. | |

FOREIGN PATENT DOCUMENTS

| | | |
|---|---|---|
| JP | S61-136559 | 8/1986 |
| JP | H07-131051 | 5/1995 |
| JP | H11-027968 | 1/1999 |
| JP | 11-046008 | 2/1999 |
| JP | 11-340493 | 12/1999 |
| JP | 2000221279 | 8/2000 |
| JP | 2002351365 A | 12/2002 |
| JP | 2003-218378 | 7/2003 |
| JP | 2006040950 | 2/2006 |
| JP | 2006107861 A | 4/2006 |
| JP | 2007-218540 | 8/2007 |
| TW | 1249862 | 2/2006 |
| TW | 200614529 | 5/2006 |
| TW | 200742912 | 11/2007 |
| TW | M356985 | 5/2009 |
| TW | 201001735 A1 | 1/2010 |
| WO | WO 2008016978 | 2/2008 |
| WO | WO 2009/101391 A2 | 8/2009 |

OTHER PUBLICATIONS

China Patent Office, Office Action, Patent Application Serial No. 201010174084.2, Jul. 26, 2011, China.

US Patent Office, Office Action, U.S. Appl. No. 12/775,082, Mar. 22, 2012, US.

Notice of Allowance, U.S. Appl. No. 12/775,082, USPTO, Jul. 9, 2012, USA.

Taiwan Patent Office, Office Action, Patent Application Serial No. 098138027, Nov. 20, 2012, Taiwan.

Japan Patent Office, Office Action, Patent Application Serial No. 2010-103474, May 29, 2012, Japan.

* cited by examiner

SOLAR ENERGY MODULE

CROSS REFERENCE TO RELATED APPLICATIONS

This application claims the benefit of U.S. Provisional Application No. 61/176,040 filed May 6, 2009.

BACKGROUND OF THE INVENTION

1. Field of the Invention

The invention relates to a solar energy module, and in particular relates to a solar energy module allowing partial solar light to penetrate therethrough.

2. Description of the Related Art

When applying conventional solar energy technology, conventional solar energy modules are often disposed on roofs or outer walls of houses or buildings. However, multi-purpose application including use as windows are hindered due to the poor transparency of conventional solar energy modules.

BRIEF SUMMARY OF INVENTION

An embodiment of a solar energy module of the invention comprises a substrate comprising at least one light diffusion layer and a plurality of light guiding layers adjacent to the light diffusion layer, and solar chips disposed on the lateral surfaces of the substrate. Solar light enters the substrate and is diffused by the light diffusion layer, and the diffused solar light is reflected by an interface of the light diffusion layer and the light guiding layer or the composite structure to be collected by the solar chips. A part of the solar light enters the light guiding layers and is reflected by the interface of the light guiding layers, and the reflected light is collected by the solar chips.

The light guiding layers are made of acrylic material, polycarbonate, polyethylene terephthalate, polyurethane, polyimide, silicon resin or glass.

The light diffusion layer is made of acrylic material, polycarbonate, polyethylene terephthalate, polyurethane, polyimide or silicon resin.

The light diffusion layer comprises light scattering particles.

The light diffusion layer comprises a mixed material of two materials with different index of refractions.

The light diffusion layer is an optical composite structure.

A heat insulation layer is preferably formed on a surface of the substrate opposite to the surface of the substrate through which solar light enters the substrate.

The heat insulation layer has high reflective rate for solar light.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
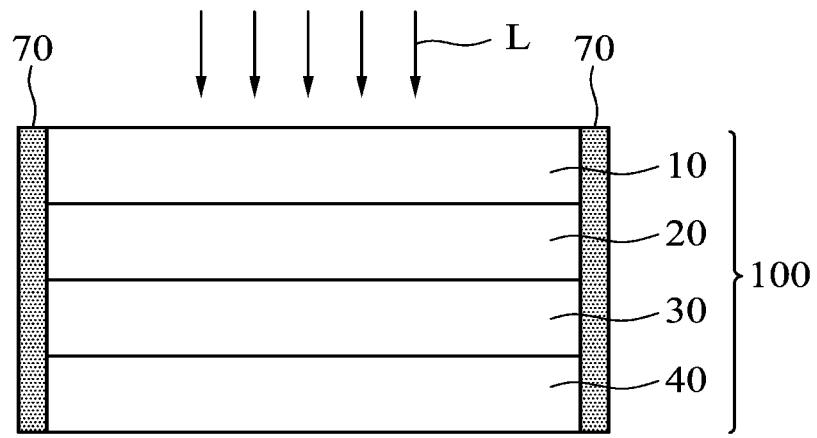
FIG. 1 is a schematic view of a solar energy module of the invention.
Figure 2:
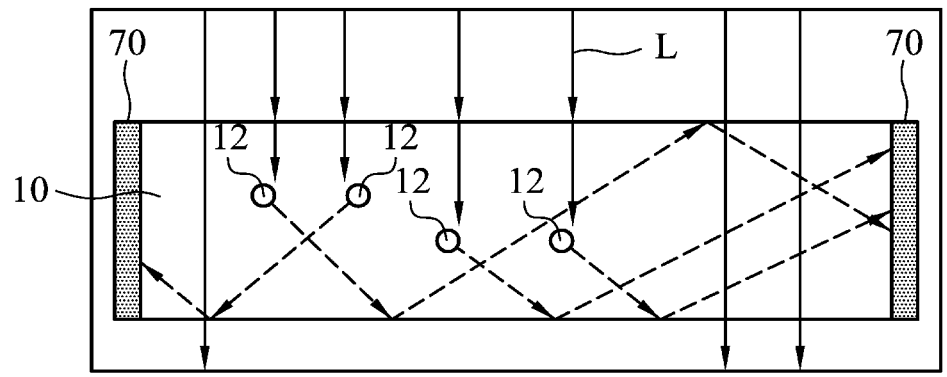
FIG. 2 is a schematic view of the light diffusion layer of the substrate of the solar energy module of the invention.

Referring to FIG. 1, a solar energy module 1000 comprises a substrate 100 and solar chips 70 disposed on lateral surfaces of the substrate 100. The substrate 100 comprises a light diffusion layer 10 and light guiding layers 20, 30 and 40. Solar light L enters the light diffusion layer 10. FIG. 2 depicts a more detailed structure of the light diffusion layer 10. Light scattering particles 12 are distributed in the light diffusion layer 10. When solar light L enters the light diffusion layer 10, solar light is scattered by the light scattering particles 12. The scattered light is reflected by the interface of the light diffusion layer 10 to be collected by the solar chips 70. The particles 12 are preferably transparent but have different index of refractions from the material of the light diffusion layer 10.

Figure 3:
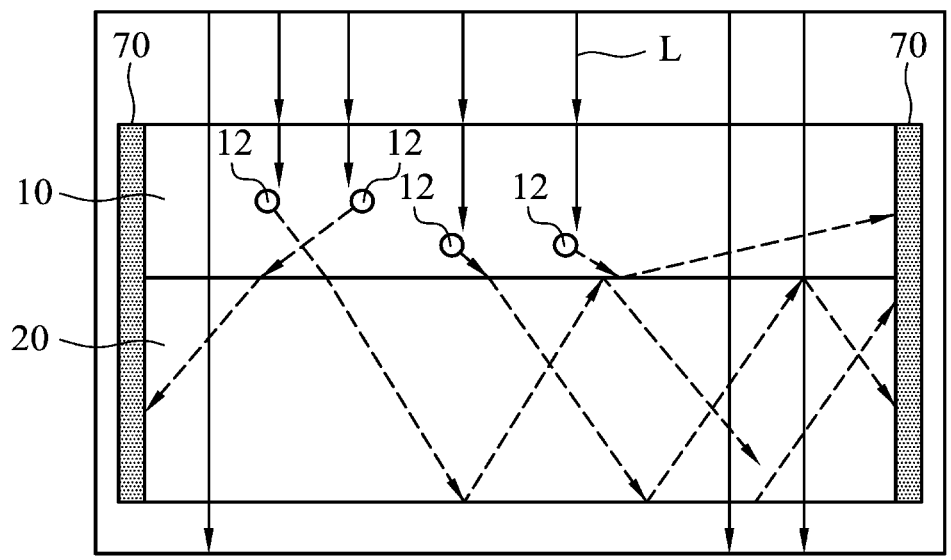
FIG. 3 depicts solar light guided to solar chips by a light diffusion layer and a light guide layer.

A part of solar light L penetrates the light diffusion layer 10 to enter the light guiding layer 20 as shown in FIG. 3. Since the index of refraction of the light diffusion layer 10 is different from the light guiding layers 20, 30 and 40, the solar light is refracted when the solar light enters the light guiding layer 20, and the refracted light is reflected by the interface of the light guiding layer 20 and collected by the solar chips 70.

The light guiding layers 20, 30 and 40 are made of acrylic material, polycarbonate, polyethylene terephthalate, polyurethane, polyimide, silicon resin or glass. The light diffusion layer is made of acrylic material, polycarbonate, polyethylene terephthalate, polyurethane, polyimide or silicon resin.

A heat insulation layer is preferably formed on the light guiding layer 40. The heat insulation layer has high reflective rate for solar light and allows a part of solar light to penetrate therethrough. The solar light penetrating the light guiding layer 20, 30 and 40 is reflected by the heat insulation layer to be collected by the solar chips 70$m$ which increases the efficiency of the solar chips 70.

In general, the substrate 10 has four lateral surfaces. The solar chips 70 can be disposed on one, two, three or four lateral surfaces of the substrate 100. When the solar chips 70 are disposed on two or three lateral surfaces of the substrate 10, reflective layers can be formed on the other lateral surfaces of the substrate 10.

The solar chips can be III-V column solar chips, single crystal silicon solar chips, poly crystal silicon solar chips or CIGS solar chips.

Transparency of the substrate 10 is 5% to 85% so that solar light is able to penetrate the substrate 10. The solar energy module of the invention can be applied to windows of buildings, whereby the outside scenery can be viewed by those inside of the building.

Although the light diffusion layer of the embodiment is in the first layer 10 which receives solar light L in this embodiment, the light diffusion layer can be in the second layer 20, third layer 30 or fourth layer 40, or the substrate 100 can comprise a plurality of light diffusion layers.

Two test examples of the solar energy module are described.

Test example A comprises a square light diffusion plate with thickness 14 mm, length 170 mm, haze 81 and transparency 45%. The solar chips of efficiency 14% are attached to lateral surfaces of the light diffusion plate to an area of 72 cm$^2$. The collection efficiency of the solar module is 1.66%.

Test example B comprises a square light diffusion plate with thickness 3 mm, length 170 mm, haze 23 and transparency 83%. The light diffusion plate is sandwiched by two glass plate of thickness 5 mm. The solar chips of efficiency 14% are attached to lateral surfaces of the light diffusion plate to an area of 72 cm$^2$. The collection efficiency of the solar module is 1.36%.

Several examples are shown as follows. Some parameters in the examples are varied to show how the solar cell efficiency is varied by the parameters.

EXAMPLE 1

The substrate comprises only one light diffusion layer but has no light guiding layer. The light diffusion layer is acrylic plate with length 81 mm, width 81 mm, thickness 14 mm and haze 5.7. Solar cells are attached to four lateral side of the substrate. A conventional commercial acrylic plate, which has the same size as the example 1 but is totally transparent, is set to be a control. The efficiency is show as follows.

|  | Haze | Total Transparency | Parallel Transparency | Efficiency |
| --- | --- | --- | --- | --- |
| Example 1 | 5.7 | 85.51 | 80.86 | 1.01% |
| Control | 0.88 | 91.89 | 91.08 | 0.51% |

EXAMPLE 2

The substrate comprises only one light diffusion layer but has no light guiding layer. The light diffusion layer is acrylic plate with length 81 mm, width 81 mm, thickness 14 mm and haze 11.38. Solar cells are attached to four lateral side of the substrate. A conventional commercial acrylic plate, which has the same size as the example 2 but is totally transparent, is set to be a control. The efficiency is show as follows.

|  | Haze | Total Transparency | Parallel Transparency | Efficiency |
| --- | --- | --- | --- | --- |
| Example 2 | 11.38 | 82.31 | 72.94 | 1.24% |
| Control | 0.88 | 91.89 | 91.08 | 0.51% |

EXAMPLE 3

The substrate comprises only one light diffusion layer but has no light guiding layer. The light diffusion layer is acrylic plate with length 81 mm, width 81 mm, thickness 14 and haze 38.7. Solar cells are attached to four lateral side of the substrate. A conventional commercial acrylic plate, which has the same size as the example 3 but is totally transparent, is set to be a control. The efficiency is show as follows.

|  | Haze | Total Transparency | Parallel Transparency | Efficiency |
| --- | --- | --- | --- | --- |
| Example 3 | 38.70 | 64.99 | 39.84 | 2.19% |
| Control | 0.88 | 91.89 | 91.08 | 0.51% |

EXAMPLE 4

The substrate comprises only one light diffusion layer but has no light guiding layer. The light diffusion layer is acrylic plate with length 81 mm, width 81 mm, thickness 14 and haze 78.77. Solar cells are attached to four lateral side of the substrate. A conventional commercial acrylic plate, which has the same size as the example 4 but is totally transparent, is set to be a control. The efficiency is show as follows.

|  | Haze | Total Transparency | Parallel Transparency | Efficiency |
| --- | --- | --- | --- | --- |
| Example 4 | 78.77 | 47.64 | 10.11 | 3.40% |
| Control | 0.88 | 91.89 | 91.08 | 0.51% |

EXAMPLE 5

The substrate comprises only one light diffusion layer but has no light guiding layer. The light diffusion layer is acrylic plate with length 168 mm, width 168 mm, thickness 14 and haze 36.56. Solar cells are attached to four lateral side of the substrate. A conventional commercial acrylic plate, which has the same size as the example 5 but is totally transparent, is set to be a control. The efficiency is show as follows.

|  | Haze | Total Transparency | Parallel Transparency | Efficiency |
| --- | --- | --- | --- | --- |
| Example 5 | 36.56 | 66.58 | 42.24 | 0.88% |
| Control | 0.88 | 91.89 | 91.08 | 0.06% |

EXAMPLE 6

The substrate comprises only one light diffusion layer but has no light guiding layer. The light diffusion layer is acrylic plate with length 168 mm, width 168 mm, thickness 14 and haze 81.88. Solar cells are attached to four lateral side of the substrate. A conventional commercial acrylic plate, which has the same size as the example 6 but is totally transparent, is set to be a control. The efficiency is show as follows.

|  | Haze | Total Transparency | Parallel Transparency | Efficiency |
| --- | --- | --- | --- | --- |
| Example 6 | 81.88 | 41.81 | 7.58 | 1.45% |
| Control | 0.88 | 91.89 | 91.08 | 0.06% |

In examples 1~6, the substrate has only one light diffusion layer but without the light guiding layer. The following examples has light guiding layers.

EXAMPLE 7

The substrate comprises one light diffusion layer (polycarbonate layer) and one light guiding layer (acrylic plate) disposed on the light diffusion layer. The light diffusion layer has length 81 mm, width 81 mm, thickness 3 and haze 78.77. The light guiding layer has a thickness of 10 mm. Solar cells are attached to four lateral side of the substrate. A conventional commercial acrylic plate, which has the same size as the example 7 but is totally transparent, is set to be a control. The efficiency is show as follows.

|  | Haze | Total Transparency | Parallel Transparency | Efficiency |
| --- | --- | --- | --- | --- |
| Example 7 | 78.77 | 61.49 | 30.58 | 2.36% |
| Control | 0.88 | 91.89 | 91.08 | 0.51% |

EXAMPLE 8

The substrate comprises one light diffusion layer (polycarbonate layer) and one light guiding layer (glass plate) disposed on the light diffusion layer. The light diffusion layer has length 168 mm, width 168 mm, thickness 3 and haze 36.05. The light guiding layer has a thickness of 10 mm. Solar cells are attached to four lateral side of the substrate. A conventional commercial acrylic plate, which has the same size as the example 8 but is totally transparent, is set to be a control. The efficiency is show as follows.

|  | Haze | Total Transparency | Parallel Transparency | Efficiency |
| --- | --- | --- | --- | --- |
| Example 8 | 78.77 | 61.49 | 30.58 | 2.36% |
| Control | 0.88 | 91.89 | 91.08 | 0.06% |

EXAMPLE 9

The substrate comprises one light diffusion layer (polycarbonate layer) and one light guiding layer (glass plate) disposed on the light diffusion layer. The light diffusion layer has length 168 mm, width 168 mm, thickness 3 and haze 50.26. The light guiding layer has a thickness of 10 mm. Solar cells are attached to four lateral side of the substrate. A conventional commercial acrylic plate, which has the same size as the example 9 but is totally transparent, is set to be a control. The efficiency is show as follows.

|  | Haze | Total Transparency | Parallel Transparency | Efficiency |
| --- | --- | --- | --- | --- |
| Example 9 | 50.26 | 61.49 | 30.58 | 1.55% |
| Control | 0.88 | 91.89 | 91.08 | 0.06% |

EXAMPLE 9a

The substrate comprises one light diffusion layer (polycarbonate layer) and one light guiding layer (glass plate) disposed on the light diffusion layer. The light diffusion layer has length 168 mm, width 168 mm, thickness 3 and haze 50.26. The light guiding layer has a thickness of 10 mm. A white screen is disposed beneath the light diffusion layer, which is to simulate a curtain behind the window glass. Solar cells are attached to four lateral side of the substrate.

|  | Haze | Total Transparency | Parallel Transparency | Efficiency |
| --- | --- | --- | --- | --- |
| Example 9a | 50.26 | 61.49 | 30.58 | 2.61% |

In the following examples, the light diffusion layer is sandwiched by two light guiding layers.

EXAMPLE 10

The substrate comprises one light diffusion layer (polycarbonate layer) and two light guiding layers (glass plate) sandwiching the light diffusion layer. The light diffusion layer has length 168 mm, width 168 mm, thickness 3 and haze 15.18. The light guiding layers have a thickness of 5 mm. Solar cells are attached to four lateral side of the substrate. A conventional commercial acrylic plate, which has the same size as the example 10 but is totally transparent, is set to be a control. The efficiency is show as follows.

|  | Haze | Total Transparency | Parallel Transparency | Efficiency |
| --- | --- | --- | --- | --- |
| Example 10 | 15.18 | 88.33 | 74.92 | 0.51% |
| Control | 0.88 | 91.89 | 91.08 | 0.06% |

EXAMPLE 11

The substrate comprises one light diffusion layer (polycarbonate layer) and two light guiding layers (glass plate) sandwiching the light diffusion layer. The light diffusion layer has length 168 mm, width 168 mm, thickness 3 and haze 36.05. The light guiding layers have a thickness of 5 mm. Solar cells are attached to four lateral side of the substrate. A conventional commercial acrylic plate, which has the same size as the example 11 but is totally transparent, is set to be a control. The efficiency is show as follows.

|  | Haze | Total Transparency | Parallel Transparency | Efficiency |
| --- | --- | --- | --- | --- |
| Example 11 | 36.05 | 67 | 30.58 | 0.57% |
| Control | 0.88 | 91.89 | 91.08 | 0.06% |

EXAMPLE 12

The substrate comprises one light diffusion layer (polycarbonate layer) and two light guiding layers (glass plate) sandwiching the light diffusion layer. The light diffusion layer has length 168 mm, width 168 mm, thickness 3 and haze 50.26. The light guiding layers have a thickness of 5 mm. Solar cells are attached to four lateral side of the substrate. A conventional commercial acrylic plate, which has the same size as the example 12 but is totally transparent, is set to be a control. The efficiency is show as follows.

|  | Haze | Total Transparency | Parallel Transparency | Efficiency |
| --- | --- | --- | --- | --- |
| Example 12 | 50.26 | 61.49 | 30.58 | 0.81% |
| Control | 0.88 | 91.89 | 91.08 | 0.06% |

EXAMPLE 13

The substrate comprises one light diffusion layer (polycarbonate layer) and two light guiding layers (glass plate) sandwiching the light diffusion layer. The light diffusion layer has length 168 mm, width 168 mm, thickness 3 and haze 64.31. The light guiding layers have a thickness of 5 mm. Solar cells are attached to four lateral side of the substrate. A conventional commercial acrylic plate, which has the same size as the example 13 but is totally transparent, is set to be a control. The efficiency is show as follows.

|  | Haze | Total Transparency | Parallel Transparency | Efficiency |
| --- | --- | --- | --- | --- |
| Example 13 | 64.31 | 42.94 | 27.61 | 1.23% |
| Control | 0.88 | 91.89 | 91.08 | 0.06% |

EXAMPLE 14

The substrate comprises one light diffusion layer (polycarbonate layer) and two light guiding layers (glass plate) sandwiching the light diffusion layer. The light diffusion layer has length 275 mm, width 220 mm, thickness 3 and haze 20.13. The light guiding layers have a thickness of 5 mm. Solar cells are attached to four lateral side of the substrate. The efficiency is show as follows.

|  | Haze | Total Transparency | Parallel Transparency | Efficiency |
| --- | --- | --- | --- | --- |
| Example 14 | 20.13 | 77.07 | 61.55 | 0.68% |

EXAMPLE 14a

The substrate comprises one light diffusion layer (polycarbonate layer) and two light guiding layers (glass plate) sandwiching the light diffusion layer. The light diffusion layer has length 275 mm, width 220 mm, thickness 3 and haze 20.13. The light guiding layers have a thickness of 5 mm. A white screen is disposed beneath the light diffusion layer, which is to simulate a curtain behind the window glass. Solar cells are attached to four lateral side of the substrate. The efficiency is show as follows.

|  | Haze | Total Transparency | Parallel Transparency | Efficiency |
| --- | --- | --- | --- | --- |
| Example 14a | 20.13 | 77.07 | 61.55 | 1.11% |

In the examples 1~4, the efficiency is increased by increasing the haze. In the examples 3~4, the larger is the substrate, the efficiency is lower. In the examples 3 and 8, the multiple layers structure has a better efficiency than the single layer structure in the same haze.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A solar energy module, comprising
a substrate comprising at least one light diffusion layer having a light incident side and a plurality of light guiding layers stacked on a side opposite to the light incident side of the at least one light diffusion layer, wherein the substrate has a transparency of 5% to 85%, and the at least one light diffusion layer comprises light scattering particles having an index of refraction different from a material of the at least one light diffusion layer;
solar chips disposed on four lateral surfaces of the at least one light diffusion layer and the plurality of light guiding layers of the substrate,
arranged such that solar light entering the at least one light diffusion layer of the substrate from the light incident side is diffused by the light scattering particles, and then a part of the diffused solar light is reflected within the at least one light diffusion layer by an interface of the at least one light diffusion layer and the plurality of light guiding layers to be collected by the solar chips disposed on the four lateral surfaces of the at least one light diffusion layer, and another part of the diffused solar light enters the plurality of light guiding layers from the at least one light diffusion layer and is reflected by an interface of the plurality of light guiding layers, and the reflected light is collected by the solar chips disposed on the four lateral surfaces of the plurality of light guiding layers.

2. The solar energy module as claimed in claim 1, wherein the plurality of light guiding layers are made of acrylic material, polycarbonate, polyethylene terephthalate, polyurethane, polyimide, silicon resin or glass.

3. The solar energy module as claimed in claim 1, wherein the solar chips comprise III-V column solar chips, single crystal silicon solar chips, poly crystal silicon solar chips or CIGS solar chips.

4. The solar energy module as claimed in claim 1, wherein the index of refraction of the at least one light diffusion layer is different from the index of refraction of the plurality of light guiding layers.

5. The solar energy module as claimed in claim 1, wherein a heat insulation layer is formed on a surface of the substrate opposite to a surface of the substrate through which solar light enters the substrate.

6. The solar energy module as claimed in claim 5, wherein the heat insulation layer reflects the diffused solar light.

7. The solar energy module as claimed in claim 1, wherein the at least one light diffusion layer is made of acrylic material, polycarbonate, polyethylene terephthalate, polyurethane, polyimide or silicon resin.

8. The solar energy module as claimed in claim 7, wherein the at least one light diffusion layer comprises a mixed material of two materials with different index of refractions.

9. The solar energy module as claimed in claim 7, wherein the at least one light diffusion layer is an optical composite structure.

* * * * *